United States Patent
Kang et al.

(10) Patent No.: US 11,842,956 B2
(45) Date of Patent: Dec. 12, 2023

(54) SEMICONDUCTOR PACKAGE

(71) Applicant: SAMSUNG ELECTRONICS CO., LTD., Suwon-si (KR)

(72) Inventors: Myung Sam Kang, Suwon-si (KR); Bong Ju Cho, Suwon-si (KR); Young Gwan Ko, Suwon-si (KR); Moon Il Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 53 days.

(21) Appl. No.: 17/355,790

(22) Filed: Jun. 23, 2021

(65) Prior Publication Data

US 2021/0320058 A1    Oct. 14, 2021

Related U.S. Application Data

(63) Continuation of application No. 16/715,697, filed on Dec. 16, 2019, now Pat. No. 11,075,152.

(30) Foreign Application Priority Data

Mar. 28, 2019    (KR) .................. 10-2019-0035865

(51) Int. Cl.
  *H01L 23/498*    (2006.01)
  *H01L 23/31*    (2006.01)
  (Continued)

(52) U.S. Cl.
  CPC .... *H01L 23/49827* (2013.01); *H01L 23/3128* (2013.01); *H01L 23/49861* (2013.01); *H01L 24/13* (2013.01); *H01L 25/0657* (2013.01)

(58) Field of Classification Search
  CPC ........... H01L 25/0657; H01L 23/49827; H01L 23/3128; H01L 23/49861; H01L 24/13;
  (Continued)

(56) References Cited

U.S. PATENT DOCUMENTS

| | | |
|---|---|---|
| 9,666,502 B2 | 5/2017 | Chen et al. |
| 10,347,613 B1 | 7/2019 | Kim et al. |
| (Continued) | | |

FOREIGN PATENT DOCUMENTS

| | | |
|---|---|---|
| CN | 102376687 A | 3/2012 |
| CN | 106549009 A | 3/2017 |
| (Continued) | | |

OTHER PUBLICATIONS

Office Action dated Sep. 13, 2023 issued by Korean Patent Office in Korean Application No. 10-2019-0035865.

*Primary Examiner* — Jasmine J Clark
(74) *Attorney, Agent, or Firm* — Sughrue Mion, PLLC

(57) ABSTRACT

A method includes forming a first package structure including a first connection member including a first redistribution layer, a first frame having a first through-portion, a first semiconductor chip having a connection pad electrically connected to the first redistribution layer, and a first encapsulant covering a portion of each of the first frame and the first semiconductor chip, forming a second package structure including a second connection member including a second redistribution layer, a second semiconductor chip having a second connection pad, and a second encapsulant covering a portion of the second semiconductor chip, forming a first through-via, the first through-via electrically connecting to the second redistribution layer, and laminating the first package structure on the second package structure. After the laminating, the first through-via penetrates through the first frame, the first encapsulant, and a portion of the first connection member, and is electrically connected to the first redistribution layer.

20 Claims, 16 Drawing Sheets

(51) Int. Cl.
  *H01L 23/00* (2006.01)
  *H01L 25/065* (2023.01)
(58) Field of Classification Search
  CPC ....... H01L 24/19; H01L 24/20; H01L 25/105; H01L 25/50; H01L 21/568; H01L 23/49816; H01L 23/5384; H01L 23/5389; H01L 2225/1047; H01L 2225/1041; H01L 2224/12105; H01L 2224/04105; H01L 2221/68372; H01L 2221/68359
  See application file for complete search history.

(56) References Cited

U.S. PATENT DOCUMENTS

| | | | |
|---|---|---|---|
| 2004/0178495 A1 | 9/2004 | Yean et al. | |
| 2010/0301474 A1 | 12/2010 | Yang | |
| 2016/0300817 A1* | 10/2016 | Do | H01L 23/49811 |
| 2017/0084518 A1 | 3/2017 | Seddon et al. | |
| 2017/0287796 A1 | 10/2017 | Lee et al. | |
| 2017/0358535 A1 | 12/2017 | Yoo et al. | |
| 2018/0061794 A1 | 3/2018 | Kim et al. | |
| 2018/0076179 A1* | 3/2018 | Hsu | H01L 24/14 |

FOREIGN PATENT DOCUMENTS

| | | |
|---|---|---|
| CN | 107492529 A | 12/2017 |
| KR | 10-2008-0063994 A | 7/2008 |
| KR | 10-2017-0112335 | 10/2017 |
| KR | 10-1922885 | 11/2018 |

\* cited by examiner

SEMICONDUCTOR PACKAGE

CROSS-REFERENCE TO RELATED APPLICATION(S)

This application is a continuation of U.S. application Ser. No. 16/715,697, filed Dec. 16, 2019, now U.S. Pat. No. 11,075,152, which claims priority to Korean Patent Application No. 10-2019-0035865 filed on Mar. 28, 2019 in the Korean Intellectual Property Office, the disclosures of each of which are incorporated by reference herein in their entireties.

BACKGROUND

1. Field

The present disclosure relates to a semiconductor package substrate, for example, a semiconductor package in which a plurality of package structures are stacked.

2. Description of Related Art

Recently, a significant trend in the development of technology related to semiconductor chips has been to reduce the size of semiconductor chips. Therefore, in the field of package technology, in accordance with a rapid increase in demand for small-sized semiconductor chips, or the like, the implementation of a semiconductor package having a compact size while including a plurality of pins has been demanded.

One type of package technology suggested to satisfy the technical demand described above is a fan-out semiconductor package. Such a fan-out semiconductor package has a compact size and may allow a plurality of pins to be implemented by redistributing solder balls or the like outwardly of a region in which a semiconductor chip is disposed.

SUMMARY

It is an aspect to provide a semiconductor package which may be thinned and achieve high performance even if a plurality of semiconductor chips are included therein.

According to an aspect of an example embodiment, there is provided a semiconductor package comprising a first connection member including a first redistribution layer; a first frame, disposed on the first connection member, having a first through-portion; a first semiconductor chip, disposed on the first through-portion, having a connection pad electrically connected to the first redistribution layer; a first encapsulant, disposed on the first connection member, covering at least a portion of each of the first frame and the first semiconductor chip and filling at least a portion of the first through-portion; a second connection member, disposed on the first encapsulant, including a second redistribution layer; a second semiconductor chip, disposed on the second connection member, having a second connection pad; a second encapsulant, disposed on the second connection member, covering at least a portion of the second semiconductor chip; and a first through-via penetrating through the first frame, the first encapsulant, and at least a portion of the first connection member, and electrically connecting the first redistribution layer and the second redistribution layer to each other.

According to another aspect of an example embodiment, there is provided a semiconductor package comprising a first package structure including a first connection member including a first redistribution layer, a first semiconductor chip, disposed on the first connection member and having a first connection pad electrically connected to the first redistribution layer, and a first encapsulant, disposed on the first connection member and covering at least a portion of the first semiconductor chip; and a second package structure including a second connection member including a second redistribution layer, a second semiconductor chip, disposed on the second connection member and having a second connection pad electrically connected to the second redistribution layer, and a second encapsulant, disposed on the second connection member and covering at least a portion of the second semiconductor chip, wherein the second package structure is disposed on the first package structure, the first redistribution layer and the second redistribution layer are electrically connected to each other by a through-via, and the through-via is surround by an insulating material, disposed in a through-hole penetrating through at least a portion of the first package structure and filling at least a portion of the through-hole.

According to another aspect of an example embodiment, there is provided a semiconductor package comprising a first connection member including a first redistribution layer; a first semiconductor chip disposed above the first connection member and including a connection pad electrically connected to the first redistribution layer; a first frame disposed above the first connection member and adjacent to the first semiconductor chip; a first encapsulant disposed above the first semiconductor chip and the first frame, and between the first semiconductor chip and the first frame; a second connection member disposed above the first encapsulant and including a second redistribution layer; a second semiconductor chip disposed above the second connection member and including a second connection pad electrically connected to the second redistribution layer; a second encapsulant disposed above the second connection member and covering at least a portion of the second semiconductor chip; and a first through-via penetrating through the first frame, the first encapsulant, and at least a portion of the first connection member, and electrically connecting the first redistribution layer and the second redistribution layer to each other.

According to another aspect of an example embodiment, there is provided a semiconductor package comprising a first package structure including a first connection member including a first redistribution layer; a frame including a through-portion, and a through-hole provided in an area of the frame other than the through-portion; a first semiconductor chip disposed on the first connection member and in the through-portion of the frame, and electrically connected to the first redistribution layer; a first encapsulant disposed on the first connection member and covering the first semiconductor chip and at least a portion of the frame; and a cover layer disposed on the first encapsulant; and a second package structure disposed on the cover layer, the second package structure including a second connection member including a second redistribution layer; and a second semiconductor chip disposed on the second connection member and electrically connected to the second redistribution layer; a through-post penetrating through the through-hole and electrically connecting the first redistribution layer to the second redistribution layer; and an insulating material disposed between the through-hole and the through-post.

BRIEF DESCRIPTION OF DRAWINGS

The above and other aspects will be more clearly understood from the following detailed description, taken in conjunction with the accompanying drawings, in which.

DETAILED DESCRIPTION

Figure 1:
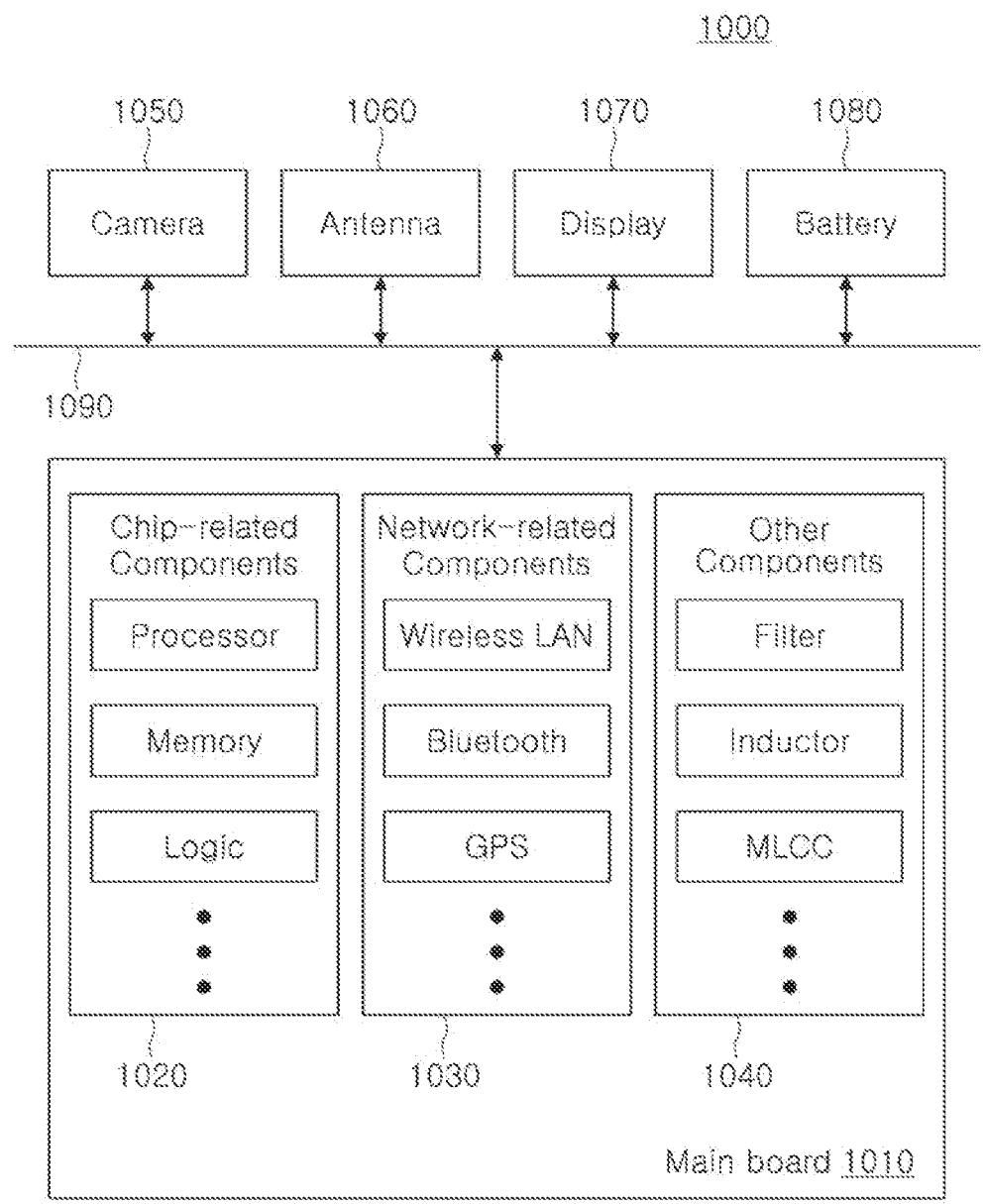
FIG. 1 is a block diagram schematically illustrating an example of an electronic device system.

Hereinafter, embodiments will be described as follows with reference to the attached drawings. The shape and size of elements in the drawings may be exaggerated or reduced for clarity.

In various example embodiments, a plurality of package structures, each including a semiconductor chip, are stacked vertically. At least one of the plurality of package structures has a through-portion in which a semiconductor chip is disposed. The stacked semiconductor package structures are electrically connected to each other by a through-via penetrating through at least a frame of one of the package structures.

First, a general environment in which semiconductor packaging technology is found and features of various types of semiconductor packaging technology will be described with reference to the accompanying drawings.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
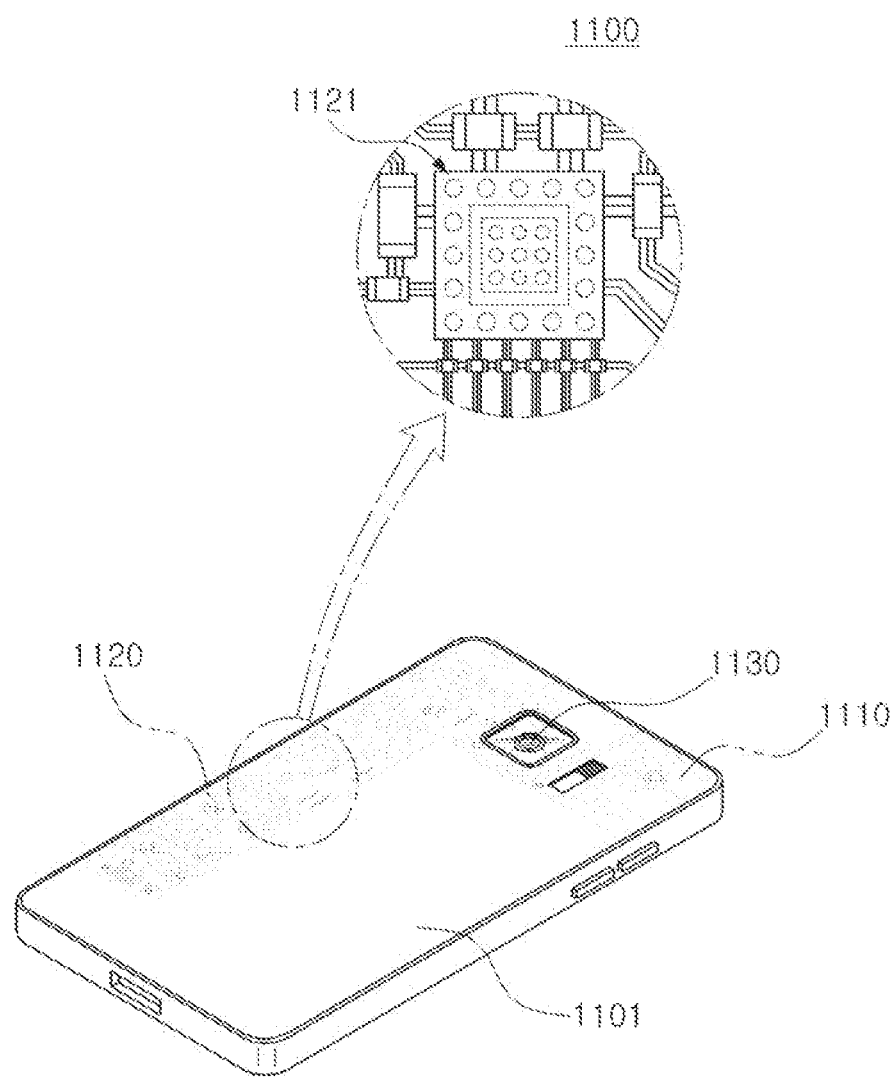
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3A:
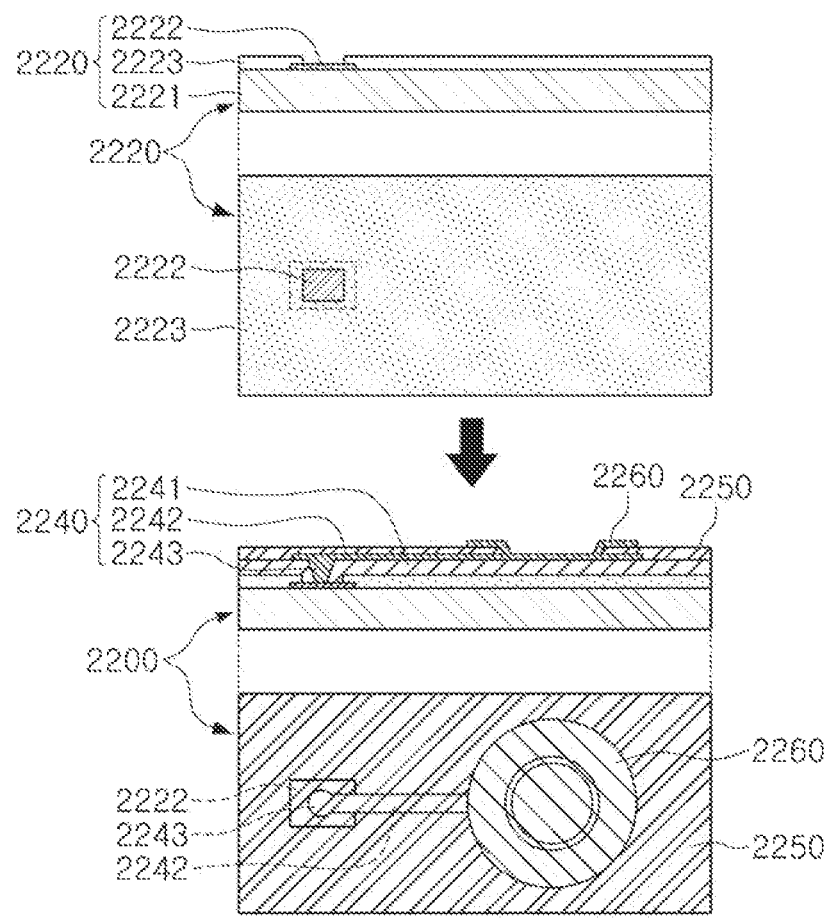
FIGS. 3A and 3B are schematic cross-sectional views illustrating states of a fan-in semiconductor package before and after being packaged.
Figure 3B:
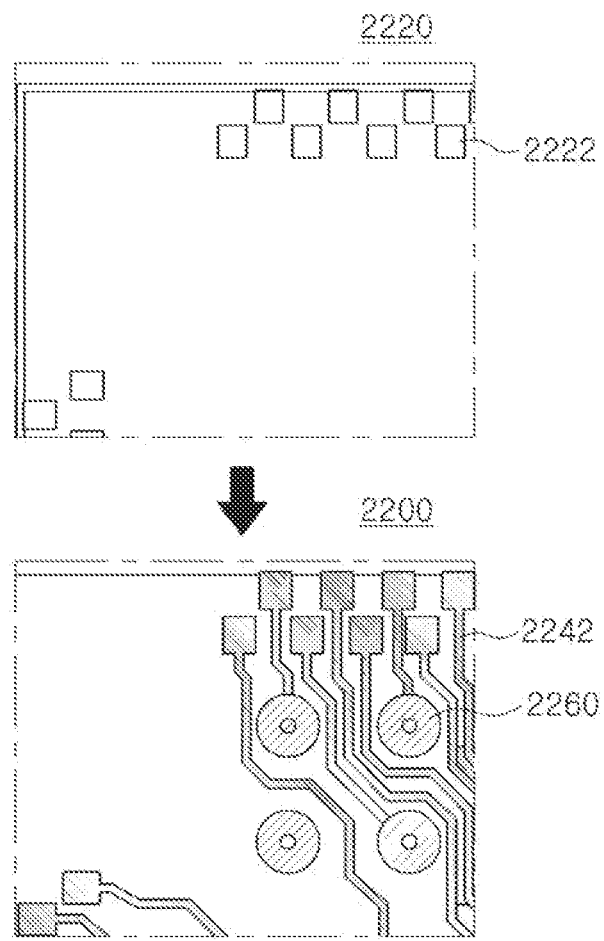

FIGS. 3A and 3B are schematic cross-sectional views illustrating states of a fan-in semiconductor package before and after being packaged.

Figure 4:
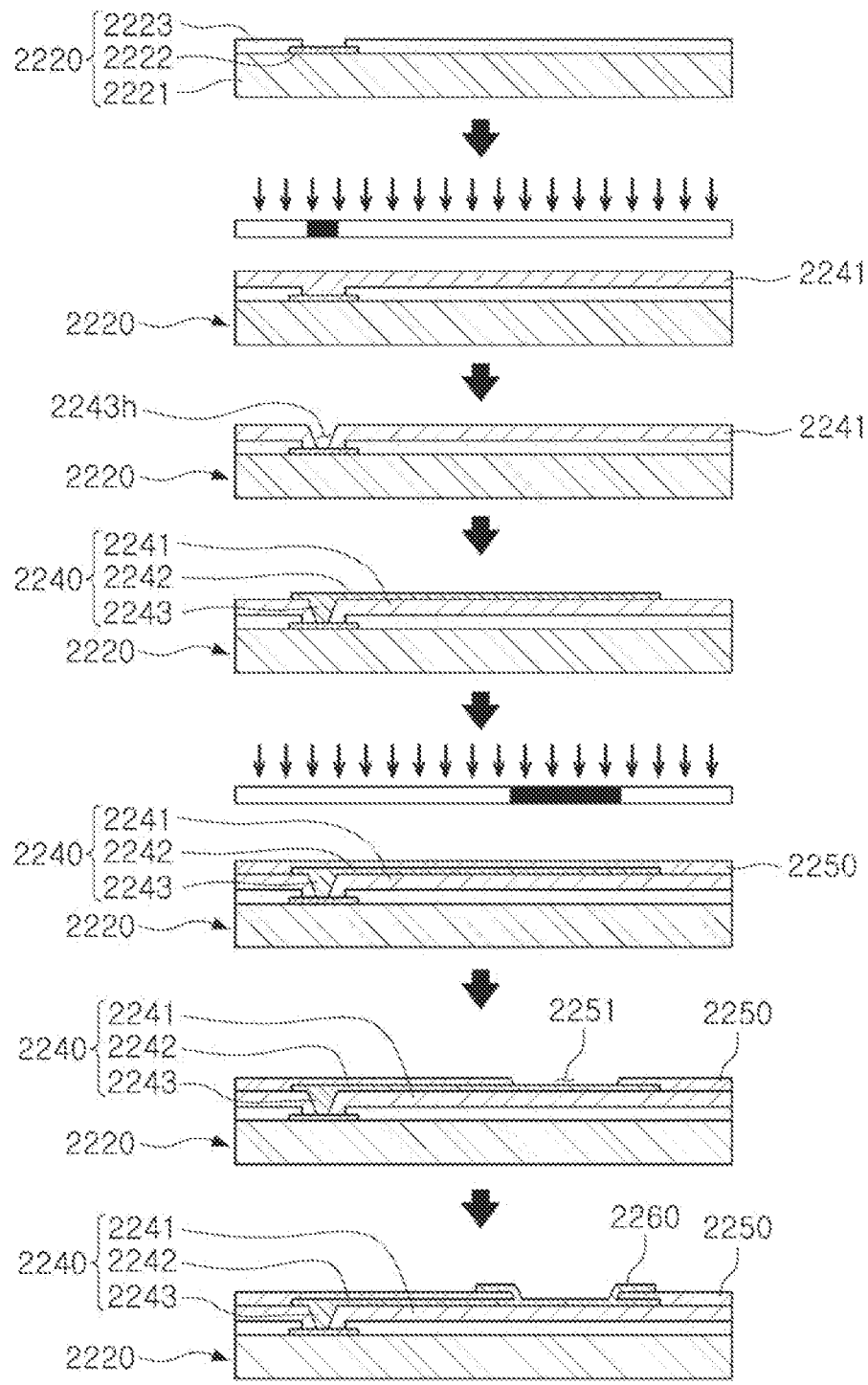
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
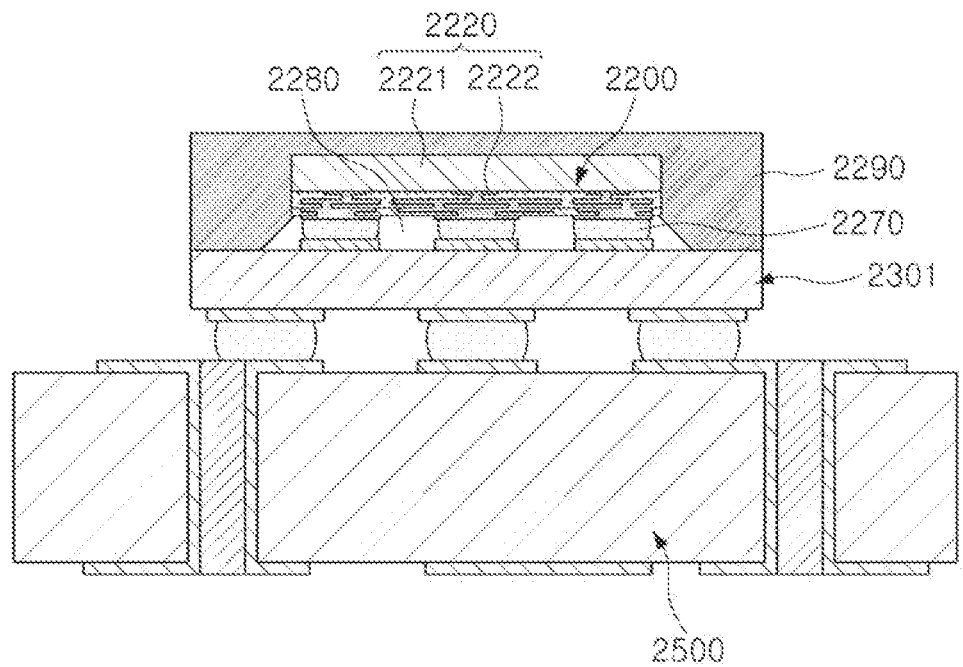
FIG. 5 is a schematic cross-sectional view illustrating a case in which a fan-in semiconductor package is mounted on a printed circuit board and is ultimately mounted on a mainboard of an electronic device.

FIG. 5 is a schematic cross-sectional view illustrating a case in which a fan-in semiconductor package is mounted on a ball grid array (BGA) substrate and is ultimately mounted on a mainboard of an electronic device.

Figure 6:
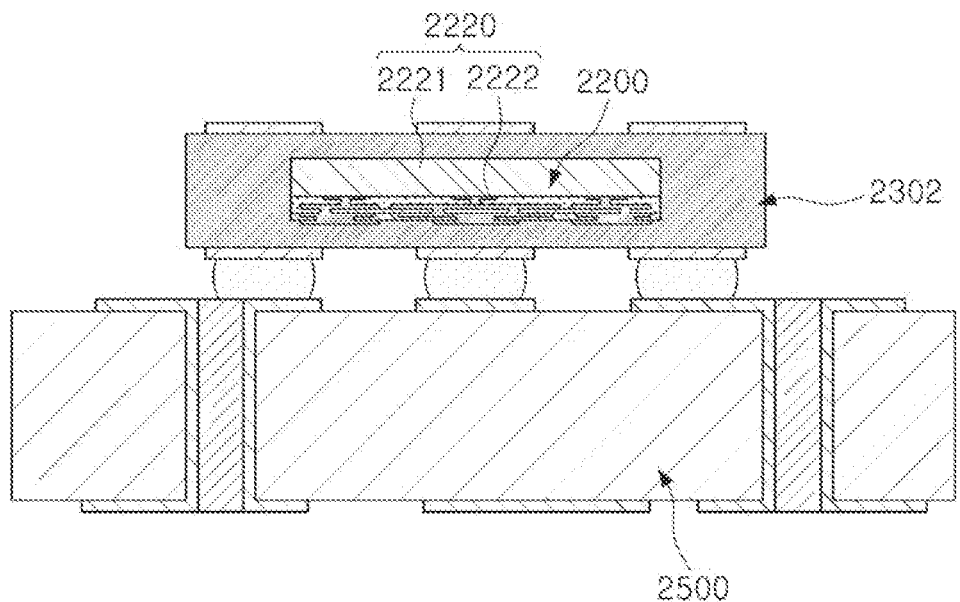
FIG. 6 is a schematic cross-sectional view illustrating a case in which a fan-in semiconductor package is embedded in a printed circuit board and is ultimately mounted on a mainboard of an electronic device.

FIG. 6 is a schematic cross-sectional view illustrating a case in which a fan-in semiconductor package is embedded in a BGA substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-Out Semiconductor Package

Figure 7:
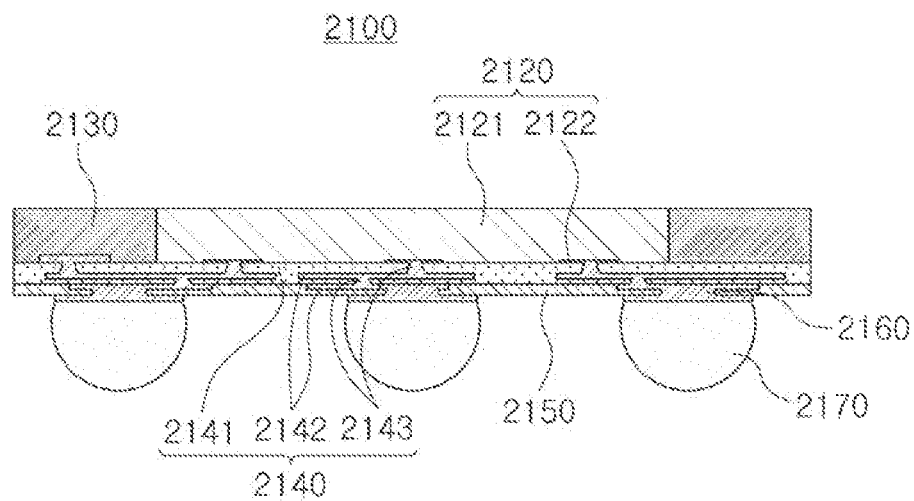
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
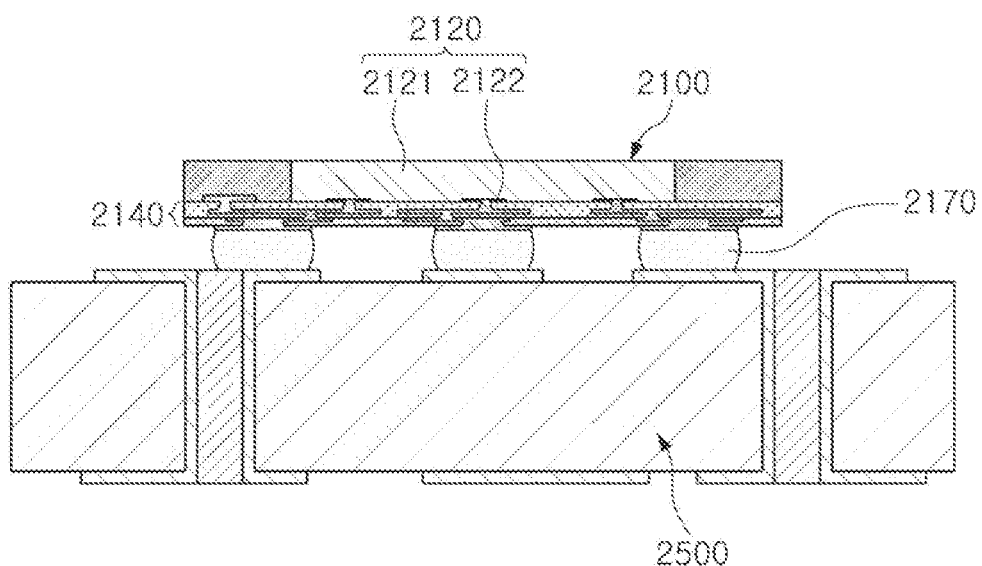
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using an additional printed circuit board (PCB) or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

Hereinafter, a semiconductor package, which may be thinned and achieve high performance even if a plurality of semiconductor chips are included therein and may address warpage, according to example embodiments, will be described with reference to accompanying drawings.

Figure 9:
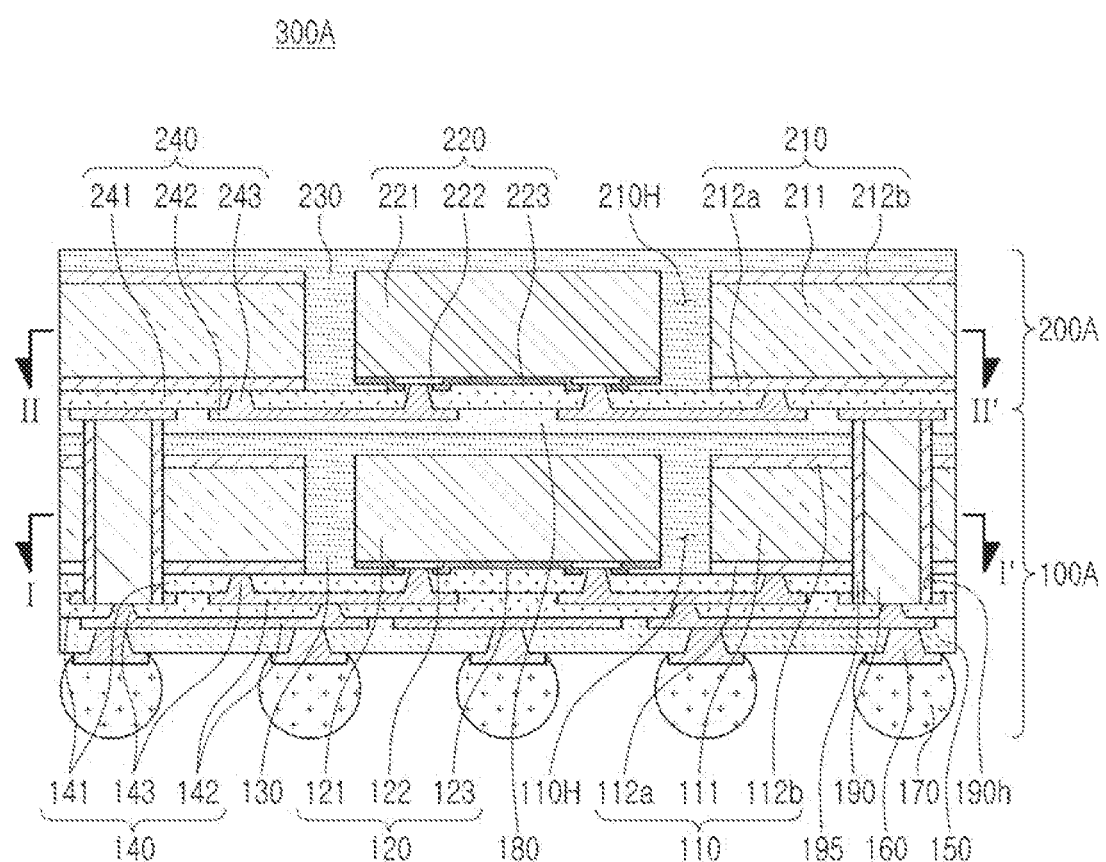
FIG. 9 is a schematic cross-sectional view illustrating an example of a semiconductor package, according to example embodiments.
Figure 10:
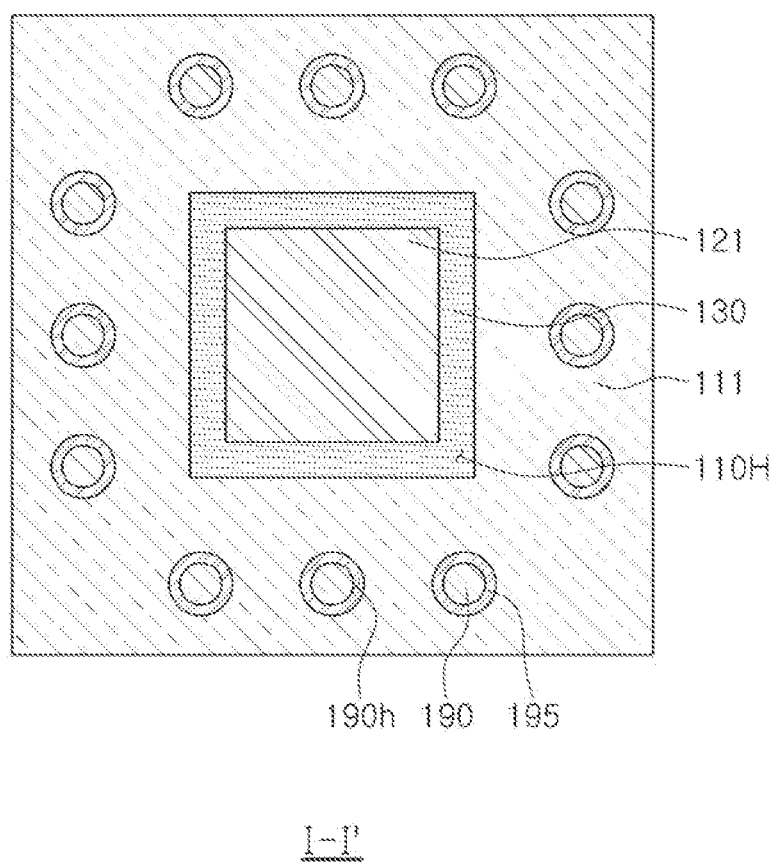
FIG. 10 is a cutaway plan view taken along line I-I' of the semiconductor package in FIG. 9, according to example embodiments.

FIG. 9 is a schematic cross-sectional view illustrating an example of a semiconductor package, according to example embodiments. FIG. 10 is a cutaway plan view taken along line I-I' of the semiconductor package in FIG. 9, according to example embodiments, and FIG. 11 is a cutaway plan view taken along line II-IF of the semiconductor package in FIG. 9, according to example embodiments.

Figure 11:
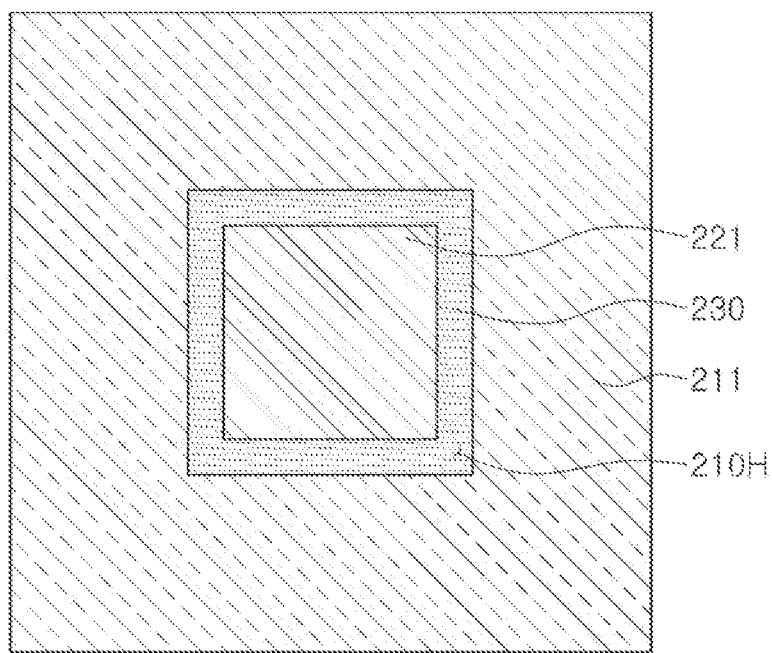
FIG. 11 is a cutaway plan view taken along line II-IF of the semiconductor package in FIG. 9, according to example embodiments.

Referring to FIGS. 9 to 11, a semiconductor package 300A includes a first package structure 100A and a second package structure 200A. The second package structure 200A is disposed on the first package structure 100A. The first and second package structures 100A and 200A are integrally coupled to each other. For example, a second connection member 240 of the second package structure 200A may be attached to a cover layer 180 of the first package structure 100A. The cover layer 180 may cover at least a portion of the second redistribution layer 242.

The first package structure 100A includes a first connection member 140 including a first redistribution layer 142, a first frame 110, disposed on the first connection member 140 and having a first through-portion 110H, a first semiconductor chip 120, disposed on the first through-portion 110H and having a connection pad 122 electrically connected to the first redistribution layer 142, a first encapsulant 130, disposed on the first connection member 140 and covering at least a portion of each of the first frame 110 and the first semiconductor chip 120 and filling at least a portion of the first through-portion 110H, a passivation layer 150 disposed on a lower side of the first connection member 100A, a plurality of underbump metals 160 respectively disposed on openings of the passivation layer 150, a plurality of electrical connection metals 170 respectively connected to the plurality of underbump metals 160, a cover layer 180 disposed on the first encapsulant 130, and a through-via 190.

The second package structure 200A includes a second connection member 240 including a second redistribution layer 240, a second frame 210, disposed on the second connection member 240 and having a second through-hole 210H, a second semiconductor chip 220, disposed in the second through-portion 210H and having a second connection pad 222 electrically connected to the second redistribution layer 242, and a second encapsulant 230, disposed on the second connection member 240 and covering at least a portion of each of the second frame 210 and the second semiconductor chip 220 and filling at least a portion of the second through-portion 210H.

In this case, the first and second redistribution layers 142 and 242 of the first and second connection members 140 and 240 are electrically connected to each other through the through-via 190 penetrating through the frame 110 and the first encapsulant 130. The through-via 190 may penetrate through at least a portion of the first connection member 140. As a result, the through-via 190 may be connected to the first redistribution layer 142 of the first connection member 140 through the first connection via 143 of the first connection member 140. In addition, the through-via 190 may penetrate through the cover layer 180 to be directly connected to the second redistribution layer 242 of the second connection member 240. An electrical path may be provided through the through-via 190.

As described above, since the semiconductor package 300A includes the second package structure 200A disposed on and integrally coupled to the first package structure 100A, a total thickness of the package 300A may be reduced. Since a vertical electrical connection path is provided through the through-via 190 while the first and second package structures 200A and 300A are integrally coupled to each other, a signal path between the first and second semiconductor chips 120 and 220 may be shortened. As a result, signal electrical characteristics may be improved. In addition, since the first package structure 100A and/or the second package structure 200A includes the first frame 110 and/or the second frame 210, process warpage may also be controlled.

The through-via 190 may penetrate through the first frame 110 and the first encapsulant 130 and may be disposed in a through-hole 190h, further penetrating at least a portion of each of the first connection member 140 and the cover layer 180. The through-via 190 may be spaced apart from the first frame 110 and the first encapsulant 130 in the through-hole 190h, and may be surrounded by an insulating material 195. The insulating material 195 may fill at least a portion of the through-hole 190h, in the through-hole 190h. By means of the above configuration, it may be further effective to provide an electrical connection in a required location, and the through-via 190 may be further tightly fixed through the insulating material 195 to improve reliability. The through-via 190 may be a cylindrical metal post, and the insulating material 195 may be a photoimageable dielectric (PID).

Hereinafter, the components of the semiconductor package 300A according to an example embodiment will be described in further detail.

The frame 110 may further improve rigidity of the package 100A according to a detailed material and may serve to secure thickness uniformity of the encapsulant 130 and the like. The first frame 110 has the first through-portion 110H penetrating through the first insulating layer 111. The first semiconductor chip 120 is disposed in the first through-portion 110H. The through-portion 110H may have a shape of a through-groove having continuously connected sidewalls. In some embodiments, the first frame 110 may further include a first conductor layer 112a and/or a second conductor layer 112b disposed on a top surface and/or a bottom surface of the insulating layer 111, respectively. In some embodiments, the first insulating layer 111 may have a multilayer structure and a conductor layer, not illustrated, may be disposed in the first frame 110. In some embodiments, a wiring via, not illustrated, may be formed to electrically connect the first and second conductor layers 112a and 112b disposed on different levels.

A material of the first insulating layer 111 is not limited and may be, for example, an insulating material. The insulating material may be a thermosetting resin such as an epoxy resin, a thermoplastic resin such as a polyimide resin, a resin in which the thermosetting resin or the thermoplastic resin is mixed with an inorganic filler, for example, ABF or the like. Alternatively, the insulating material may be a material in which the abovementioned resin is impregnated together with an inorganic filler in a core material such as a glass fiber (or a glass cloth or a glass fabric), for example, prepreg, or the like.

Each of the first and second conductor layers 112a and 112b may include a metal material such as copper (Cu), aluminum (Al), silver (Ag), tin (Sn), gold (Au), nickel (Ni), lead (Pb), titanium (Ti), or alloys thereof. The first and second conductor layers 112a and 112b may be formed by a plating process and may include a seed layer and a plated layer, respectively. In some embodiments, the first conductor layer 112a and/or the second conductor layer 112b may be disposed to extend to a wall surface of the first through-portion 110H. As a result, the first conductor layer 112a and/or the second conductor layer 112b may surround a periphery of a side surface of the first semiconductor chip 120. In this case, heat radiation and electromagnetic interference (EMI) shielding effects may be achieved. In some embodiments, the first conductor layer 112a and/or the second conductor layer 112b may be used as a ground pattern. The first conductor layer 112a may be electrically connected to the first redistribution layer 142 through the first connection via 143 of the first connection member 140. For example, the first conductor layer 112a may be electrically connected to a ground pattern of the first redistribution layer 142.

The first semiconductor chip 120 may be an integrated circuit (IC) in a bare state in which hundreds to millions of elements are integrated in a single chip. An integrated circuit (IC) of the first semiconductor chip 120 may be, for example, a memory chip of a volatile memory (for example, a DRAM), a nonvolatile memory (for example, a ROM), a flash memory, or the like. Alternatively, the integrated circuit (IC) of the first semiconductor chip 120 may be an application processor chip such as a central processor (for example, a central processing unit (CPU)), a graphics processor (for example, a graphics processing unit (GPU)), a digital signal processor, a cryptographic processor, a microprocessor, a microcontroller, or the like. Alternatively, the integrated circuit (IC) of the first semiconductor chip 120 may be a logic chip of an analog-to-digital converter, an application-specific integrated circuit, or the like.

The first semiconductor chip 120 may include a first body 121 in which various circuits are formed. A first connection pad 122 may be formed on an active surface of the first body. The first body may 121 be formed based on, for example, an active wafer. In this case, a base material may be silicon (Si), germanium (Ge), gallium arsenide (GaAs), or the like. The first connection pad 122 may be provided to electrically connect the first semiconductor chip 120 to another component. The first connection pad 122 may be formed of a metal material, for example, copper (Cu), aluminum (Al), or the like. The first semiconductor chip 122 may have an active surface on which a first passivation layer 123, including an oxide layer, having an opening exposing at least a portion of the first connection pad 122, and/or a nitride layer, may be formed. An insulating layer, not illustrated, may be further disposed in another required location. The first semiconductor chip 120 may be a bare die. In this case, the first connection pad 122 may be in physical contact with the first connection via 143. However, in some embodiments, the first semiconductor chip 120 may be a packaged die having an active surface on which a redistribution layer, not illustrated, and a metal bump, not illustrated, and the like are further formed.

The first encapsulant 130 may cover at least a portion of each of the first frame 110 and the first semiconductor chip 120. In addition, the first encapsulant 130 may fill at least a portion of the first through-portion 110H. The first encapsulant 130 includes an insulating material. The insulating material may be a material including an inorganic filler and an insulating resin, for example, a thermosetting resin such as an epoxy resin, a thermoplastic resin such as a polyimide resin, or a resin in which a reinforcing material such as an inorganic filler is included in such a resin, more specifically, ABF, FR-4, BT, or the like. Alternatively, the insulating material may be a molding material such as an EMC. In some embodiments, the insulating material may be a photoimageable material, in detail, a photoimageable encapsulant (PIE). In some embodiments, the insulating material may be prepreg or the like.

The first connection member 140 may redistribute the first connection pad 122 of the first semiconductor chip 120. Respective first connection pads 122 of tens to millions of first semiconductor chip 120, having various functions, may be redistributed through the first connection member 140 and may be physically and/or electrically connected to an external component through the electrical connection metal 170 depending on functions thereof. The first connection member 140 includes a first insulating layer 141, a first redistribution layer 142 disposed on a bottom surface of the first insulating layer 141, and a first connection via 143, penetrating through the first insulating layer 141, connected to the first redistribution layer 142. The numbers of the first insulating layers 141, the first redistribution layers 142, and the first connection vias 143 may be greater or smaller than those illustrated in the drawings. For example, the number of layers, constituting the first connection member 140, may vary.

A material of the first insulating layer 141 may be an insulating material. The insulating material may be a photoimageable dielectric (PID). In this case, a fine pitch may be introduced through a photo via, which is advantageous in microcircuit and high-density semiconductor chips. Thus, tens to hundreds of first connection pads 122 of the first semiconductor chip 120 may be effectively redistributed. In a case in which plural first insulating layers 141 are provided, boundaries between the first insulating layers 141 may be apparent or unapparent.

The first redistribution layer 142 may redistribute the first connection pad 122 of the first semiconductor chip 120 and may electrically connect the redistributed first connection pad 122 to the electrically connection metal 170. The first redistribution layer 142 may be formed of a metal material such as copper (Cu), aluminum (Al), silver (Ag), tin (Sn), gold (Au), nickel (Ni), lead (Pb), titanium (Ti), or alloys thereof. The first redistribution layer 142 may also perform various functions depending on a design thereof. For example, the first redistribution layer 142 may include a ground (GND) pattern, a power (PWR) pattern, a signal (S) pattern, and the like. The ground (GND) pattern and the power (PWR) pattern are the same as each other. In addition, the redistribution layer 142 may include various types of via pads, an electrical connection metal pad, and the like. The first redistribution layer 142 may also be formed by a plating process and may include a seed layer and a conductor layer.

The first connection via 143 may electrically connect the first redistribution layer 142 respectively to the first connection pad 122 and the through-via 190. In the case in which the first redistribution layer 142 has a multilayer structure, the first redistribution layer 142 electrically connect the first redistribution layers 142, disposed on different layers, to each other. The first connection via 143 may also be formed of a metal material such as copper (Cu), aluminum (Al), silver (Ag), tin (Sn), gold (Au), nickel (Ni), lead (Pb), titanium (Ti), or alloys thereof. The first connection via 143 may include a via for signal, a via for power, a via for grounding, or the like. The via for power and the via for grounding may be the same as each other. The first connection via 143 may be a filled-type via filed with a metal, or a conformal-type via in which a metal material is formed along a wall surface of a via hole. The first connection via 143 may also be formed by a plating process, and may include a seed layer and a conductor layer.

The first passivation layer 150 is an additional component disposed on a lower side of the first connection member 140 to protect the connection member 1240 from external physical and chemical damage and the like. The first passivation layer 150 may include a thermosetting resin. For example, the first passivation layer 150 may be an ABF, but a material of the first passivation layer 150 is not limited thereto. The first passivation layer 150 may have a plurality of openings exposing at least a portion of the first redistribution layer 142. There may be tens to tens of thousands of openings. The number of openings may be greater or smaller than tens to several tens of thousands. Each of the openings may include a plurality of holes.

An underbump metal 160 may be also an additional component and may improve connection reliability of the electrical connection metal 170 to board-level reliability of the semiconductor package 300A. There may be tens to millions of openings. The number of openings may be greater or smaller than tens to millions. The underbump metal 160 may be disposed on each opening of the passivation layer 150 to be electrically connected to the exposed first redistribution layer 142. The underbump metal 160 may be formed by a metallization method using a metal, but a method of forming the underbump metal 160 is not limited thereto.

The electrical connection metal 170 is also an additional component configured to physically and/or electrically connect the semiconductor package 300A to an external component. For example, the semiconductor package 300A may mount the electrical connection metal 170 on a mainboard of an electrical device through the electrical connection metal 170. The electrical connection metal 170 may be disposed on a bottom surface of the passivation layer 150 and may be electrically connected to the underbump metal 160. The electrical connection metal 170 may be formed of a low melting point metal, for example, tin (Sn) or a tin-containing alloy. More specifically, the electrical connection metal 170 may be formed of a solder or the like, but such materials are just an example and a material of the electrical connection metal 170 is not limited thereto.

The electrical connection metal 170 may be a land, a ball, a pin, or the like. The electrical connection metal 170 may be formed as a multilayer structure or a single-layer structure. In the case in which the electrical connection metal 170 is formed as a multilayer structure, the electrical connection metal 170 may include a copper post and a solder. In the case in which the electrical connection metal 170 is formed as a single-layer structure, the electrical connection metal 170 may include a tin-silver solder or copper. However, such materials are just an example, and a material of the electrical connection metal 170 is not limited thereto. The number, an interval, a disposition, and the like, of the electrical connection metal 170 are not limited, and may be sufficiently modified by a person skilled in the art depending on design particulars of the first connection pad 122 or the like.

At least one of the electrical connection metals 170 may be disposed in a fan-out region. The term "fan-out region" refers to a region except for a region in which the first semiconductor chip 120 is disposed. The fan-out package may have improved reliability as compared to a fan-in package, may allow a plurality of input/output (I/O) terminals to be implemented, and may facilitate a three-dimensional (3D) interconnection. Moreover, as compared to a ball grid array (BGA) package, a land grid array (LGA) package, or the like, the fan-out package may be manufactured to have a small thickness, and may be superior in price competitiveness.

The cover layer 180 may be disposed between the first encapsulant 130 and the second connection member 240 to connect the first encapsulant 130 and the second connection member 240 to each other. The cover layer 180 may cover at least a portion of the second redistribution layer 242 of the second connection member 240. The cover layer 180 may include a photoimageable dielectric (PID), but a material of the cover layer 180 is not limited thereto. The cover layer 180 may include a thermosetting resin such as an epoxy resin, a thermoplastic resin such as a polyimide resin, or a resin in which a reinforcing material such as an inorganic filler is included in such a resin, more specifically, ABF, FR-4, BT, or the like.

The through-via 190 is formed to electrically connect the first package structure 100A and the second package structure 200A to each other. The through-via 190 may electrically connect the first redistribution layer 142 of the first connection member 140 and the second redistribution layer 242 of the second connection member 240 to each other. The through-via 190 may penetrate through the first frame 110 and the first encapsulant 130. In some embodiments, the through-via 190 may be disposed in the through-hole 190h further penetrating through at least a portion of each of the first connection member 140 and the cover layer 180. The through-via 190 may be spaced apart from the first frame 110 and the first encapsulant 130 in the through-hole 190h and may be surrounded by the insulating material 195, filling at least a portion of the through-hole 190h, in the through-hole 190h. The through-via 190 may be a cylindrical metal post, for example, a copper post, and the insulating material 195 may be a photoimageable dielectric (PID). In the drawings, a bottom surface of the through-via 190, a bottom of the insulating material 195, and a bottom surface of a primary first redistribution layer 142 are coplanar with each other, but this is only an example, and in some embodiments, the bottom surface of the through-via 190, the bottom of the insulating material 195, and the bottom surface of a primary first redistribution layer 142 may be located on different levels. For example, the bottom surface of the through-via 190 and the bottom surface of the insulating material 195 may be disposed below the bottom surface of the first redistribution layer 142. In this case, a height of the first connection via 143, connected to the through-via 190, may be smaller than a height of the first connection via 143 connecting the first redistribution layers 142 disposed on different levels.

The second frame 210 may further improve rigidity of the second package structure 200A depending on a detailed material of the second insulating layer 211, and may serve to secure thickness uniformity of the second encapsulant 230. The second frame 210 may have a second through-portion 210H penetrating through the second insulating layer 211. A second semiconductor chip 220 is disposed in the second through-portion 210H. The second through-portion 210H may have a shape of a through-groove having continuously connected sidewalls. In some embodiments, the second frame 210 may further include a third conductor layer 212a and/or a fourth conductor layer 212b disposed on a top surface and/or a bottom surface of the second insulating layer 211, respectively. In some embodiments, the second insulating layer 211 may have a multilayer structure, and a conductor layer, not illustrated, may be disposed in the second frame 210. In some embodiments, a wiring via, not illustrated, may be disposed to electrically connect the conductor layers 212a and 212b disposed on different levels.

A material of the second insulating layer 211 is not limited and may be, for example, an insulating material. The insulating material may be a thermosetting resin such as an epoxy resin, a thermoplastic resin such as a polyimide resin, a resin in which the thermosetting resin or the thermoplastic resin is mixed with an inorganic filler, for example, ABF or the like. Alternatively, the insulating material may be a material in which the abovementioned resin is impregnated together with an inorganic filler in a core material such as a glass fiber (or a glass cloth or a glass fabric), for example, prepreg, or the like.

Each of the third and fourth conductor layers 212a and 212b may include a metal material such as copper (Cu), aluminum (Al), silver (Ag), tin (Sn), gold (Au), nickel (Ni), lead (Pb), titanium (Ti), or alloys thereof. The third and fourth conductor layers 212a and 212b may be formed by a known plating process and may include a seed layer and a plated layer, respectively. In some embodiments, the third conductor layer 212a and/or the fourth conductor layer 212b may be disposed to extend to a wall surface of the second through-portion 210H. As a result, the second conductor layer 212a and/or the third conductor layer 212b may surround a periphery of a side surface of the second semiconductor chip 220. In this case, heat radiation and electromagnetic interference (EMI) shielding effects may be achieved. The third conductor layer 212a and/or the fourth conductor layer 212b may be used as a ground pattern. The third conductor layer 112a may be electrically connected to the second redistribution layer 242 through the second connection via 233 of the second connection member 240. For example, the third conductor layer 212a may be electrically connected to a ground pattern of the second redistribution layer 242.

The second semiconductor chip 220 may be an integrated circuit (IC) in a bare state in which hundreds to millions of elements are integrated in a single chip. An integrated circuit (IC) of the second semiconductor chip 220 may be, for example, a memory chip of a volatile memory (for example, a DRAM), a nonvolatile memory (for example, a ROM), a flash memory, or the like. Alternatively, the integrated circuit (IC) of the second semiconductor chip 220 may be an application processor chip such as a central processor (for example, a central processing unit (CPU)), a graphics processor (for example, a graphics processing unit (GPU)), a digital signal processor, a cryptographic processor, a microprocessor, a microcontroller, or the like. Alternatively, the integrated circuit (IC) of the second semiconductor chip 220 may be a logic chip of an analog-to-digital converter, an application-specific integrated circuit, or the like. As an unlimited example, the semiconductor package 300A may be used a stacked memory package.

The second semiconductor chip 220 may include a second body 221 in which various circuits are formed. A second connection pad 222 may be formed on an active surface of the first body. The second body 221 may be formed based on, for example, an active wafer. In this case, a base material may be silicon (Si), germanium (Ge), gallium arsenide (GaAs), or the like. The second connection pad 222 may be provided to electrically connect the second semiconductor chip 220 to another component. The second connection pad 222 may be formed of a metal material, for example, copper (Cu), aluminum (Al), or the like. The second semiconductor chip 222 may have an active surface on which a second passivation layer 223, including an oxide layer, having an opening exposing at least a portion of the second connection pad 222, and/or a nitride layer, may be formed. An insulating layer, not illustrated, may be further disposed in another required location. The second semiconductor chip 220 may be a bare die. In this case, the second connection pad 222 may be in physical contact with the second connection via 243. However, In some embodiments, the second semiconductor chip 220 may be a packaged die having an active surface on which a redistribution layer, not illustrated, and a metal bump, not illustrated, and the like ate further formed.

The second encapsulant 230 may cover at least a portion of each of the second frame 210 and the second semiconductor chip 220. In addition, the second encapsulant 230 may fill at least a portion of the second through-portion 210H. The second encapsulant 230 includes an insulating material. The insulating material may be a material including an inorganic filler and an insulating resin, for example, a thermosetting resin such as an epoxy resin, a thermoplastic resin such as a polyimide resin, or a resin in which a reinforcing material such as an inorganic filler is included in such a resin, more specifically, ABF, FR-4, BT, or the like. Alternatively, the insulating material may be a molding material such as an EMC. In some embodiments, the insulating material may be a photoimageable material, in detail, a photoimageable encapsulant (PIE). In some embodiments, the insulating material may be prepreg or the like.

The second connection member 240 may redistribute the second connection pad 222 of the second semiconductor chip 220. Respective second connection pads 222 of tens to millions of first semiconductor chips 220, having various functions, may be redistributed through the second connection member 240. The second connection member 240 includes a second insulating layer 241, a second redistribution layer 242 disposed on a bottom surface of the second insulating layer 241, and a second connection via 243, penetrating through the second insulating layer 241, connected to the second redistribution layer 242. The numbers of the second insulating layers 241, the second redistribution layers 242, and the second connection vias 243 may be greater or smaller than those illustrated in the drawings. For example, the number of layers, constituting the second connection member 240, may vary depending on a design.

A material of the second insulating layer 241 may be an insulating material. The insulating material may be a photoimageable dielectric (PID). In this case, a fine pitch may be introduced through a photo via, which is advantageous in microcircuit and high-density design. Thus, tens to hundreds of second connection pads 222 of the second semiconductor chip 220 may be effectively redistributed. In a case in which plural second insulating layers 241 are provided, boundaries between the second insulating layers 241 may be apparent or unapparent.

The second redistribution layer 242 may redistribute the second connection pad 222 of the second semiconductor chip 220. The second redistribution layer 242 may be formed of a metal material such as copper (Cu), aluminum (Al), silver (Ag), tin (Sn), gold (Au), nickel (Ni), lead (Pb), titanium (Ti), or alloys thereof. The second redistribution layer 142 may also perform various functions depending on a design thereof. For example, the second redistribution layer 242 may include a ground (GND) pattern, a power (PWR) pattern, a signal (S) pattern, and the like. The ground (GND) pattern and the power (PWR) pattern are the same as each other. In addition, the redistribution layer 242 may include various types of via pads, an electrical connection metal pad, and the like. The second redistribution layer 242 may also be formed by a plating process and may include a seed layer and a conductor layer.

The second connection via 243 may electrically connect the second redistribution layer 242 respectively to the second connection pad 222. In the case in which the second redistribution layer 242 has a multilayer structure, the second redistribution layer 242 electrically connect the second redistribution layers 242, disposed on different layers, to each other. The second connection via 243 may also be formed of a metal material such as copper (Cu), aluminum (Al), silver (Ag), tin (Sn), gold (Au), nickel (Ni), lead (Pb), titanium (Ti), or alloys thereof. The second connection via 243 may include a via for signal, a via for power, a via for grounding, or the like. The via for power and the via for grounding may be the same as each other. The second connection via 243 may be a filled-type via filed with a metal, or a conformal-type via in which a metal material is formed along a wall surface of a via hole. The second connection via 243 may also be formed by a plating process, and may include a seed layer and a conductor layer.

FIGS. 12 to 15 are process diagrams illustrating an example of manufacturing the semiconductor package in FIG. 9, according to example embodiments.

Figure 12:
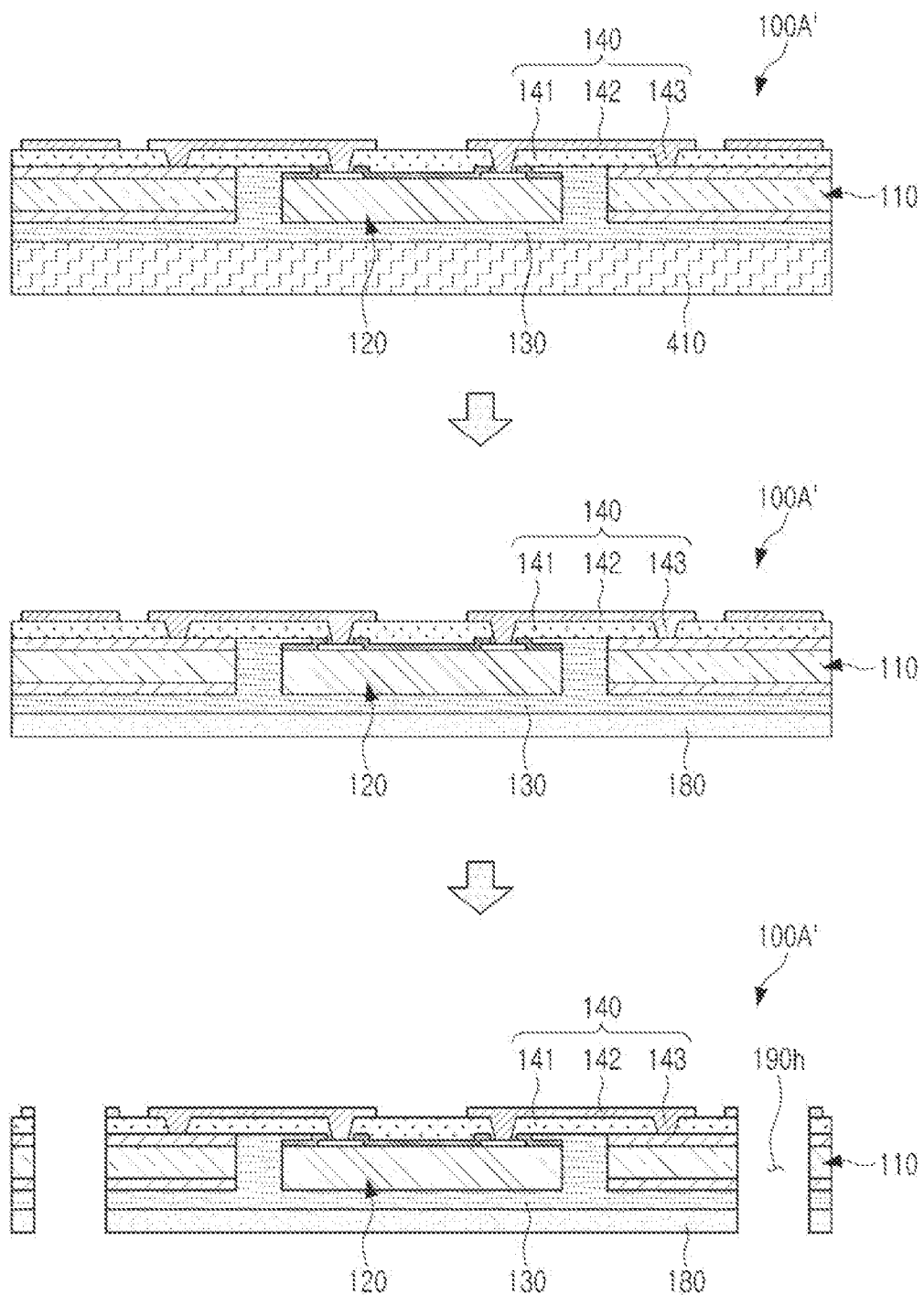
FIGS. 12 to 15 are process diagrams illustrating an example of manufacturing the semiconductor package in FIG. 9, according to example embodiments.

Referring to FIG. 12, a precursor 100A' of a first package structure is prepared. For example, the precursor 100A' of the first package structure, including a first frame 110, a first semiconductor chip 120, a first encapsulant 130, and a portion of a first insulating layer 140, a portion of a first connection via 143, and a portion of a first redistribution layer 142, may be formed using a first carrier 410. A cover layer 180 is attached to a region in which the first carrier 410 is removed. A though-hole 190h, penetrating through the portion of the first connection 140, the first frame 110, the first encapsulant 130, and the cover layer 180, is formed using laser drilling and/or mechanical drilling.

Figure 13:
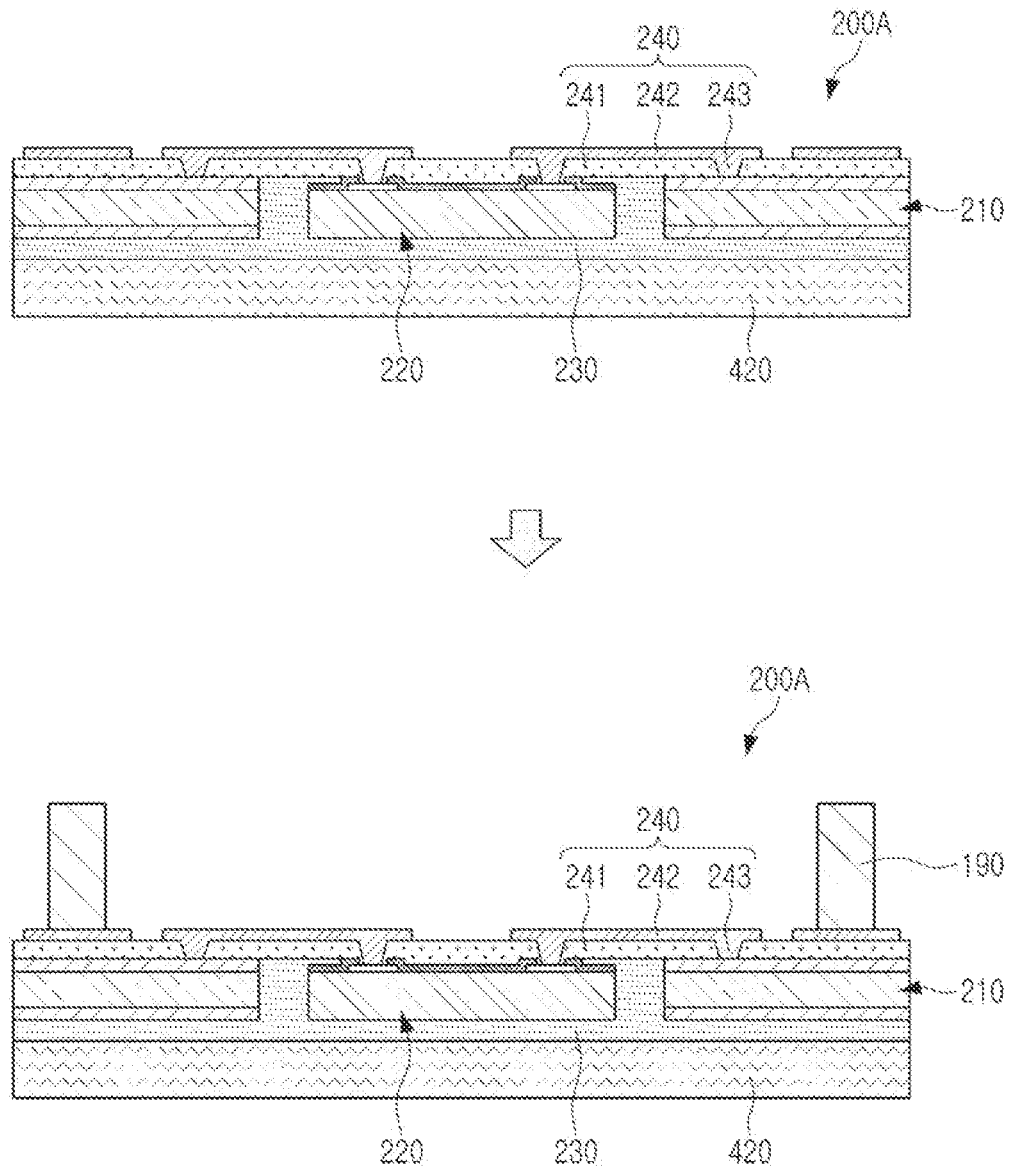

Referring to FIG. 13, a second package structure 200A is prepared. For example, the second package structure 200A, including a second frame 210, a second semiconductor chip 220, a second encapsulant 230, and a second connection member 240, may be formed using a second carrier 420. A through-via 190 is formed on a second redistribution layer 242 of the second connection member 240. The through-via 190 may be in the form of a metal post having a roughly cylindrical shape. The through-via 190 may be formed by a plating process using a resist film.

Figure 14:
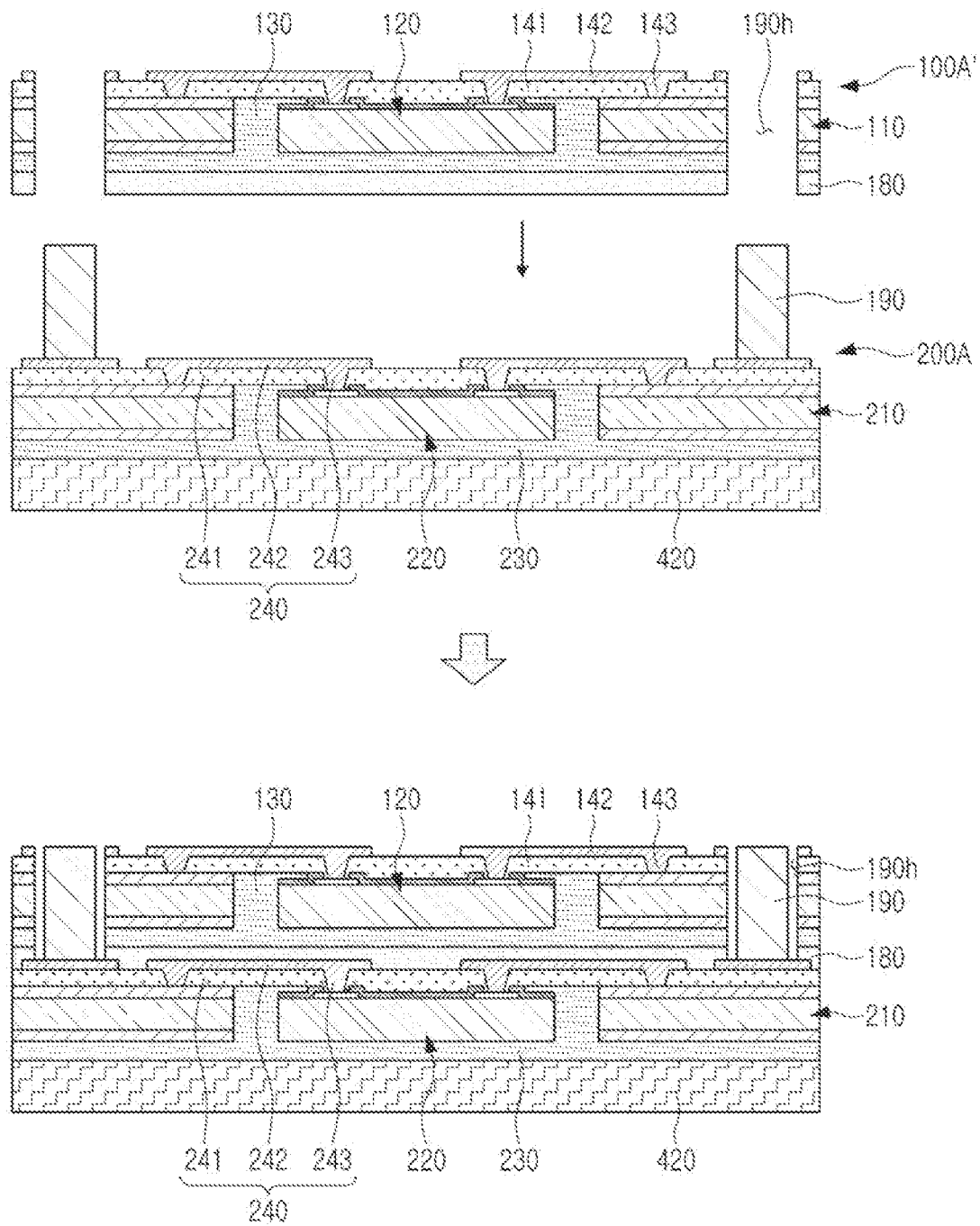

Referring to FIG. 14, the prepared precursor 100A' of the first package structure is laminated on the prepared second package structure 200A. For example, the precursor 100A' of the first package structure may be laminated on the second package structure 200A in such a manner that the through-via 190, disposed on the second redistribution layer 242 of the second connection member 240, is disposed in the through-hole 190h formed on the precursor 100A' of the first package structure. In this case, at least a portion of the second redistribution layer 242 of the second connection member 240 may be embedded in the cover layer 180.

Figure 15:
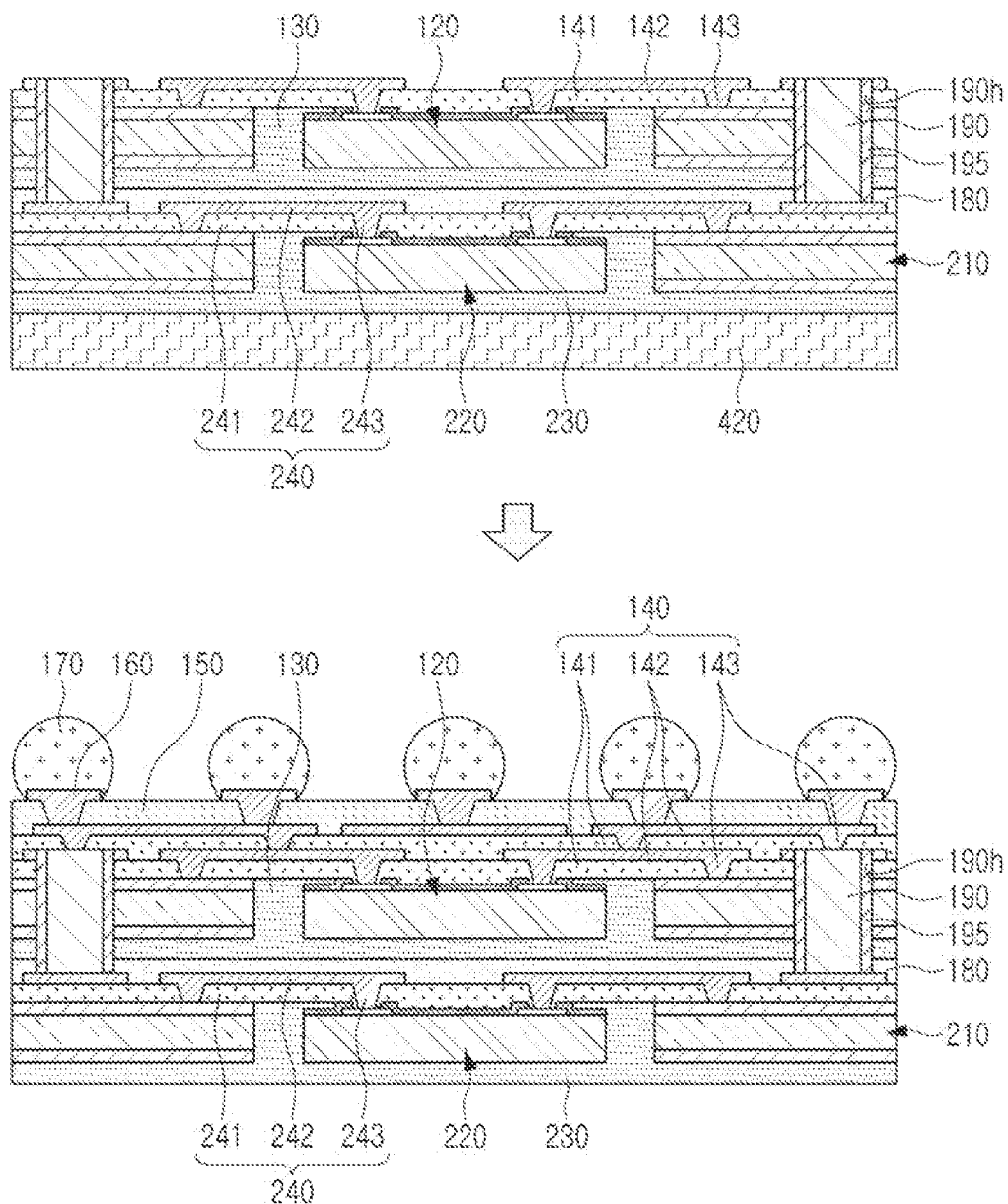

Referring to FIG. 15, at least a portion of the through-hole 190h is filled with the insulating material 195. In some embodiments, the insulating material 195 may be disposed to cover at least a portion of the first redistribution layer 142 and may include a photoimageable dielectric. Therefore, a portion of the insulating material 195 may be used as a portion of the first insulating layer 141 of the first connection member 140. In some embodiments, a passivation layer 150 and an underbump metal 160 are formed on the first connection member 140. The second carrier 420 is removed. In some embodiments, an electrical connection metal 170 is formed to be connected to the underbump metal 160, and a reflow process is performed. As a result, a semiconductor package 300A including the first package structure 100A and the second package structure 200A may be manufactured.

Figure 16:
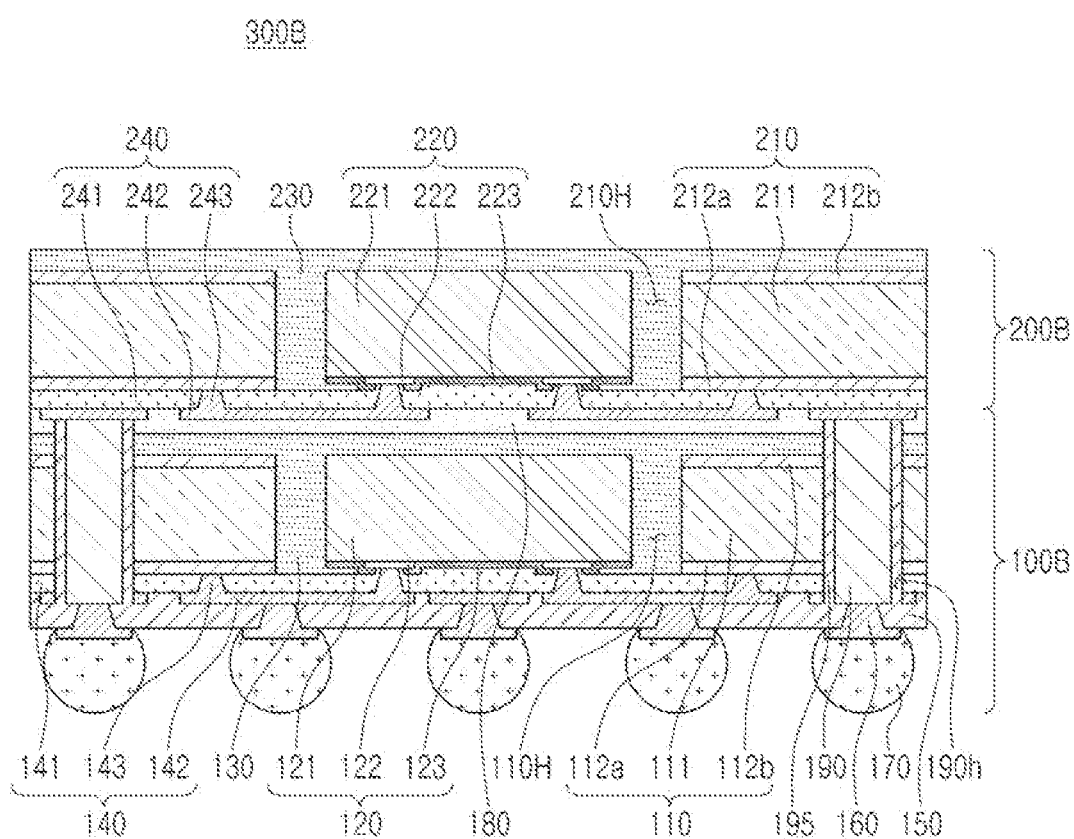
FIG. 16 is a schematic cross-sectional view illustrating another example of a semiconductor package, according to example embodiments.

FIG. 16 is a schematic cross-sectional view illustrating another example of a semiconductor package, according to example embodiments.

Referring to FIG. 16, a semiconductor package 300B may include a first package structure 100B, which is slightly different from the above-described first package structure 100A of the semiconductor package 300A, and a second package structure 200B which is the same as the above-described second package structure 200A of the semiconductor package 300A. More specifically, as shown in FIG. 16, at least a portion of a passivation layer 150 of the first package structure 100B may fill at least a portion of a through-hole 190h as an insulating material 195. For example, when the through-hole 190h is filled with the insulating material 195, the insulating material 195 may be formed to cover a first connection member 140. Thus, the portion of the insulating material 195 that does not fill the through-hole 190h may be used as the passivation layer 150. Descriptions of the other components are substantially the same as described above, and will be omitted herein for conciseness.

Figure 17:
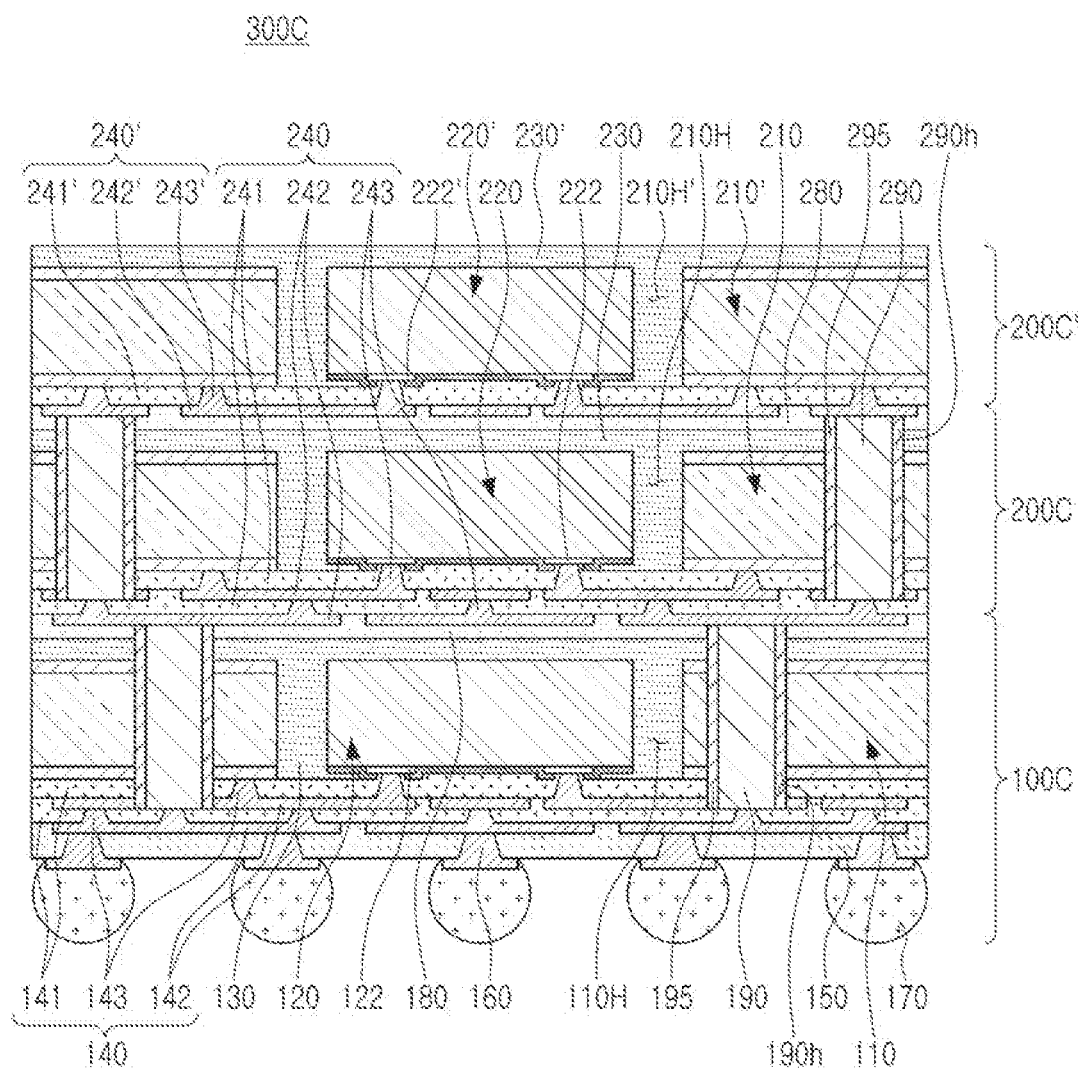
FIG. 17 is a schematic cross-sectional view illustrating an example of a semiconductor package, according to example embodiments.

FIG. 17 is a schematic cross-sectional view illustrating an example of a semiconductor package, according to example embodiments.

Referring to FIG. 17, a semiconductor package 300C may include a third package structure 200C' further disposed on a second package structure 200C, similarly to the above-described semiconductor package 300A in which the second package structure 200A is disposed on the first package structure 100A. For example, a greater number of package structures 100C, 200C, and 200C' may be stacked vertically and may be integrally coupled to each other.

The first package structure 100C may include a first connection member 140 including a first redistribution layer 142, a first frame 110, disposed on the first connection member 140, having a first through-portion 110H, a first semiconductor chip 120, disposed in the first through-portion 110H, having a first connection pad 122 electrically connected to the first redistribution layer 142, a first encap-sulant 130, disposed on the first connection member 140, covering at least a portion of each of the first frame 110 and the first semiconductor chip 120 and filling at least a portion of the first through-portion 110H, a passivation layer 150 disposed on a lower side of the first connection member 100C, a plurality of underbump metals 160, each being disposed on an opening of the passivation layer 150, a plurality of electrical connection metals 170 respectively connected to the plurality of underbump metals 160, a first cover layer 180 disposed on the first encapsulant 130, and a first through-via 190.

The second package structure 200C may include a second connection member 240 including a second redistribution layer 242, a second frame 210, disposed on the second connection member 240, having a second through-portion 210H, a second semiconductor chip 220, disposed in the second through-portion 210H, having a second connection pad 222 electrically connected to the second redistribution layer 242, a second encapsulant 230, disposed on the second connection member 240, covering at least a portion of each of the second frame 210 and the second semiconductor chip 220 and filling at least a portion of the second through-portion 210H, a second cover layer 280 disposed on the second encapsulant 230, and a second through-via 290.

The third package structure 200C' may include a third connection member 240' including a third redistribution layer 242', a third frame 210', disposed on the third connection member 240', having a third through-portion 210H', a third semiconductor chip 220', disposed in the third through-portion 210H', having a third connection pad 222' electrically connected to the third redistribution layer 242', and a third encapsulant 230', disposed on the third connection member 240', covering at least a portion of each of the third frame 210' and the third semiconductor chip 220' and filling at least a portion of the third through-portion 210H'.

The first and second redistribution layers 142 and 242 of the first and second connection members 140 and 240 are electrically connected to each other through the first through-via 190 penetrating through at least the first frame 110 and the first encapsulant 130. The first through-via 190 may penetrate through at least a portion of the first connection member 140. As a result, the first through-via 190 may be connected to the first redistribution layer 141 of the first connection member 140 through the first connection via 143 of the first connection member 140. The first through-via 190 may penetrate through the first cover layer 180 to be directly connected to the second redistribution layer 242 of the second connection member 240. An electrical connection path may be provided through the first through-via 190. The first through-via 190 may penetrate through the first frame 110 and the first encapsulant 130. In some embodiments, the first through-via 190 may be disposed in the first through-hole 190h further penetrating through at least a portion of each of the first connection member 140 and the first cover layer 180. The first through-via 190 may be spaced apart from the first frame 110 and the first encapsulant 130 in the first through-hole 190h, and may be surrounded by the first insulating material 195, filling at least a portion of the first through-hole 190h, in the first through-hole 190h. The first through-via 190 may have shape of a roughly cylindrical metal post, and the first insulating material 195 may be a photoimageable dielectric. However, the shape and the material thereof are not limited thereto.

The second and third redistribution layers 242 and 242' of the second and third connection members 240 and 240' may be electrically connected to each other through the second through-via 290 penetrating through at least the second frame 210 and the second encapsulant 230. The second through-via 290 may penetrate through at least a portion of the second connection member 240. As a result, the second through-via 290 may be connected to the second redistribution layer 242 of the second connection member 240 through the second connection via 243 of the second connection member 240. The second through-via 290 may penetrate through the second cover layer 280 to be directly connected to the third redistribution layer 242' of the third connection member 240'. An electrical connection path may be provided through the second through-via 290. The second through-via 290 may penetrate through the second frame 210 and the second encapsulant 230. In some embodiments, the second through-via 290 may be disposed in the second through-hole 290h further penetrating through at least a portion of each of the second connection member 240 and the second cover layer 280. The second through-via 290 may be spaced apart from the second frame 210 and the second encapsulant 230 in the second through-hole 290h and may be surrounded by the second insulating material 295, filling at least a portion of the second through-hole 290h, in the second through-hole 290h. The second through-via 290 may have a shape of a roughly cylindrical metal post and the second insulating material 295 may be a photoimageable dielectric. However, the shape and the material thereof are not limited thereto.

Descriptions of the other components are substantially the same as described above, and will be omitted herein for conciseness.

As described above, a semiconductor package, which may be thinned and achieve high performance even if a plurality of semiconductor chips are included therein, may be provided.

In the present disclosure, a "lower" side, a "lower portion", a "lower surface", and the like, are used to refer to a direction toward a mounting surface of the fan-out semiconductor package in relation to cross sections of the drawings, while an "upper" side, an "upper" portion, an "upper" surface, and the like, are used to refer to a direction opposite to the direction toward a mounting surface. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a "first" element may be referred to as a "second" element without departing from the scope of the claims set forth herein. Similarly, a "second" element may also be referred to as a "first" element.

The term "an example embodiment" used herein does not refer to the same example embodiment, and is provided to emphasize a particular feature or characteristic different from that of another exemplary embodiment. However, example embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an example embodiment rather than limiting the present disclosure. In this case, singular forms include plural forms unless interpreted otherwise in context.

While example embodiments have been shown and described above, it will be apparent to those skilled in the art that modifications and variations could be made without departing from the scope of the present disclosure as defined by the appended claims.

What is claimed is:

1. A method of manufacturing a semiconductor package, the method comprising:
   forming a first package structure, the first package structure comprising a first connection member including a first redistribution layer, a first frame disposed on the first connection member and having a first through-portion, a first semiconductor chip disposed in the first through-portion and having a connection pad electrically connected to the first redistribution layer, and a first encapsulant disposed on the first connection member and covering at least a portion of each of the first frame and the first semiconductor chip;
   forming a second package structure, the second package structure comprising a second connection member including a second redistribution layer, a second semiconductor chip disposed on the second connection member and having a second connection pad, and a second encapsulant disposed on the second connection member and covering at least a portion of the second semiconductor chip;
   forming a first through-via disposed on the second connection member, the first through-via electrically connecting to the second redistribution layer; and
   laminating the first package structure on the second package structure;
   wherein, after the laminating, the first through-via penetrates through the first frame, the first encapsulant, and at least a portion of the first connection member, and is electrically connected to the first redistribution layer.

2. The method of claim 1, further comprising:
   forming a first through-hole that penetrates through at least one of a portion of the first connection member, the first frame, and the first encapsulant,
   wherein the first through-via is disposed in the first through-hole.

3. The method of claim 2, wherein the first through-hole is formed using at least one of laser drilling and mechanical drilling.

4. The method of claim 2, wherein the first through-via has a shape of a cylindrical metal post.

5. The method of claim 2, further comprising:
   filling at least a portion of the first through-hole with an insulating material,
   wherein the first through-via is spaced apart from the first frame and the first encapsulant in the first through-hole, and
   wherein the first through-via is surrounded by the insulating material in the first through-hole.

6. The method of claim 5, wherein the insulating material comprises a photoimageable dielectric (PID).

7. The method of claim 5, further comprising:
   forming a passivation layer on a first side of the first connection member opposing a second side on which the first frame and the first semiconductor chip are disposed by, when the at least a portion of the first through-hole is filled with the insulating material, forming the insulating material to include;
an extension portion on the first side of the first connection member.

8. The method of claim 1, wherein the first through-via is connected to the first redistribution layer through a first connection via of the first connection member.

9. The method of claim 2, further comprising:
attaching a cover layer to the first encapsulant before forming the first through-hole,
wherein the first through-hole penetrates through the cover layer.

10. The method of claim 9, wherein
the cover layer is disposed between the first encapsulant and the second connection member, and covers at least a portion of the second redistribution layer,
wherein the first through-via penetrates through the cover layer to be directly connected to the second redistribution layer.

11. The method of claim 1, wherein the first through-via is formed by a plating process using a resist film.

12. The method of claim 1, further comprising:
forming a passivation layer on a side of the first connection member opposing a side on which the first frame and the first semiconductor chip are disposed, wherein the passivation layer has a plurality of openings each exposing at least a portion of the first redistribution layer;
forming a plurality of underbump metals on the plurality of openings of the passivation layer respectively, each being electrically connected to the exposed portion of the first redistribution layer; and
forming a plurality of electrical connection metals, respectively connected to the plurality of underbump metals to be each electrically connected to the exposed portion of the first redistribution layer.

13. The method of claim 1, wherein the second package structure further comprises a second frame, disposed on the second connection member and having a second through-portion in which the second semiconductor chip is disposed, and
the second encapsulant covers at least a portion of the second frame and fills at least a portion of the second through-portion.

14. The method of claim 13, further comprising:
forming a third package structure, the third package structure comprising a third connection member disposed on the second encapsulant and including a third redistribution layer, a third frame disposed on the third connection member and having a third through-portion, a third semiconductor chip disposed in the third through-portion and having a third connection pad electrically connected to the third redistribution layer, and a third encapsulant disposed on the third connection member and covering at least a portion of each of the third frame and the third semiconductor chip and filling at least a portion of the third through-portion;
forming a second through-via on the third connection member and electrically connecting the third redistribution layer; and
laminating the second package structure on the third package structure;
wherein the second through-via penetrates through the second frame, the second encapsulant, and at least a portion of the second connection member, and is electrically connected to the second redistribution layer.

15. A method of manufacturing a semiconductor package, the method comprising:
forming a first package structure, the first package structure comprising a first connection member including a first redistribution layer, a first semiconductor chip disposed on the first connection member and having a first connection pad electrically connected to the first redistribution layer, and a first encapsulant disposed on the first connection member and covering at least a portion of the first semiconductor chip;
forming a through-hole that penetrates the at least one of a portion of the first connection member and the first encapsulant;
forming a second package structure, the second package structure comprising a second connection member including a second redistribution layer, a second semiconductor chip disposed on the second connection member and having a second connection pad electrically connected to the second redistribution layer, and a second encapsulant disposed on the second connection member and covering at least a portion of the second semiconductor chip;
forming a through-via disposed on the second connection member and electrically connecting the second redistribution layer;
laminating the first package structure on the second package structure; and
filling an insulating material in at least a portion of the through-hole,
wherein, after the laminating, the first redistribution layer and the second redistribution layer are electrically connected to each other by the through-via, and
the through-via is surrounded by the insulating material, disposed in the through-hole penetrating through at least a portion of the first package structure.

16. The method of claim 15, wherein the first package structure further comprises a first frame, disposed on the first connection member and having a first through-portion in which the first semiconductor chip is disposed,
the first encapsulant covers at least a portion of the first frame and fills at least a portion of the first through-portion, and
the first through-portion penetrates through the first frame and the first encapsulant.

17. A method of manufacturing a semiconductor package, the method comprising:
forming a first package structure, the first package structure comprising a first connection member including a first redistribution layer, a first semiconductor chip disposed above the first connection member and including a connection pad electrically connected to the first redistribution layer, a first frame disposed above the first connection member and adjacent to the first semiconductor chip, and a first encapsulant disposed above the first semiconductor chip and the first frame, and between the first semiconductor chip and the first frame;
forming a second package structure, the second package structure comprising a second connection member including a second redistribution layer, and a second semiconductor chip disposed above the second connection member and including a second connection pad electrically connected to the second redistribution layer,
forming a through-via disposed on the second connection member and electrically connecting the second redistribution layer; and laminating the first package structure on the second package structure;

wherein, after the laminating, the through-via penetrates through the first frame, the first encapsulant, and at least a portion of the first connection member, and is electrically connected to the first redistribution layer.

18. The method of claim 17, further comprising:

forming a through-hole that penetrates through the at least one of a portion of the first connection member, the first frame, and the first encapsulant; and filling at least a portion of the through-hole with an insulating material after laminating the first package structure on the second package structure, wherein the through-via is disposed in the through-hole and surrounded by the insulating material.

19. The method of claim 18, further comprising:

forming a passivation layer below the first connection member, wherein the passivation layer is directly in contact with the insulating material and integrated with the insulating material.

20. The method of claim 17, further comprising:

forming electrical connection metals protruding from a lower surface of the first connection member and electrically connected to the first redistribution layer.

* * * * *